United States Patent
Lien et al.

(10) Patent No.: US 6,421,265 B1
(45) Date of Patent: Jul. 16, 2002

(54) DRAM-BASED CAM CELL USING 3T OR 4T DRAM CELLS

(75) Inventors: Chuen-Der Lien, Los Altos Hills; Chau-Chin Wu; Ta-Ke Tien, both of Cupertino, all of CA (US)

(73) Assignee: Integrated Devices Technology, Inc., Santa Clara, CA (US)

( * ) Notice: Subject to any disclaimer, the term of this patent is extended or adjusted under 35 U.S.C. 154(b) by 18 days.

(21) Appl. No.: 09/816,742

(22) Filed: Mar. 22, 2001

(51) Int. Cl.[7] .............................................. G11C 15/00
(52) U.S. Cl. ..................... 365/49; 365/189.05
(58) Field of Search ........................... 365/49, 52, 120, 365/102, 63, 189.05, 191

(56) References Cited

U.S. PATENT DOCUMENTS

| | | | | |
|---|---|---|---|---|
| 5,146,300 A | * | 9/1992 | Hamamoto et al. | 357/23.6 |
| 5,396,449 A | | 3/1995 | Atallah et al. | 365/49 |
| 5,828,593 A | * | 10/1998 | Schultz et al. | 365/49 |
| 5,949,696 A | * | 9/1999 | Threewitt | 365/49 |
| 6,101,116 A | | 8/2000 | Lien et al. | 365/49 |
| 6,128,207 A | | 10/2000 | Lien et al. | 365/49 |
| 6,154,384 A | * | 11/2000 | Nataraja et al. | 365/49 |
| 6,157,558 A | | 12/2000 | Wong | 365/49 |
| 6,181,591 B1 | * | 1/2001 | Miyatake et al. | 365/49 |
| 6,195,278 B1 | * | 2/2001 | Calin et al. | 365/49 |

* cited by examiner

*Primary Examiner*—David Nelms
*Assistant Examiner*—Thong Le
(74) *Attorney, Agent, or Firm*—Bever, Hoffman & Harms LL (57) ABSTRACT

A CAM cell including three-transistor (3T) or four-transistor (4T) DRAM cells. Data is stored using intrinsic capacitance of each 3T or 4T DRAM cell, and is applied to the gate terminal of a pull-down transistor. Read operations are performed in the 3T and 4T DRAM cells without disturbing the stored data value by applying the stored data value to the gate terminal of a pull-down transistor and detecting the operating state (i.e., turned on or turned off) of a pull-down transistor, thereby avoiding the charge sharing problems associated with 1T DRAM cells.

26 Claims, 4 Drawing Sheets

DRAM-BASED CAM CELL USING 3T OR 4T DRAM CELLS

FIELD OF THE INVENTION

The present invention relates to content addressable memory (CAM) arrays. More specifically, the present invention relates to dynamic random-access-memory-based (DRAM-based) CAM arrays.

BACKGROUND OF THE INVENTION

Conventional read-write or "random access" memory (RAM) arrays include RAM cells arranged in rows and columns, and addressing circuitry that accesses a selected row of RAM cells using address data corresponding to the physical address of the RAM cells. That is, data words stored in the rows of conventional RAM cells are accessed by applying address signals to the RAM array input terminals. In response to each unique set of address signals, a RAM array outputs a data word that is read from a portion of the RAM array designated by the address.

Unlike conventional RAM arrays, content addressable memory (CAM) arrays include memory cells that are addressed in response to their content, rather than by a physical address within a RAM array. Specifically, a CAM array receives a data value that is compared with all of the data values stored in the rows of the CAM array. In response to each unique data value applied to the CAM array input terminals, the rows of CAM cells within the CAM array assert or de-assert associated match signals indicating whether or not one or more data values stored in the CAM cell rows match the applied data value. CAM arrays are useful in many applications, such as search engines.

Similar to conventional RAM devices, CAM devices can either be formed utilizing dynamic random access memory (DRAM) cells, in which data values are stored using capacitors, or formed utilizing static random access memory (SRAM) cells, in which data values are stored using bistable flip flops.

Figure 1A:
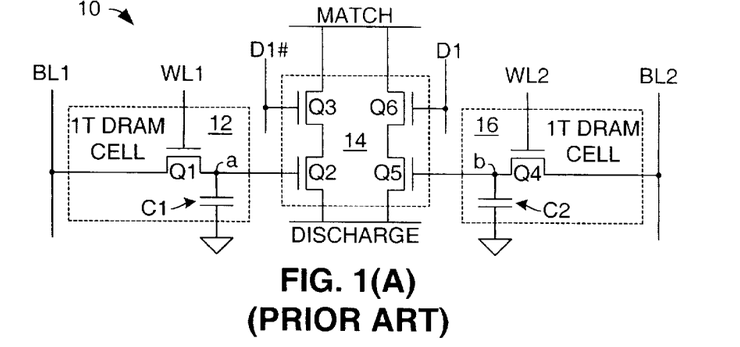
FIGS. 1(A), 1(B) and 1(C) are schematic diagrams showing conventional CAM cells.

FIG. 1(A) is a circuit diagram showing a conventional dynamic-based (DRAM-based) CAM cell 10, which includes a pair of one-transistor (1T) DRAM cells 12 and 16, and a four-transistor comparator circuit 14 made up of transistors Q2 through Q6. DRAM cell 12 includes transistor Q1 and a capacitor structure C1, which combine to form a storage node a that receives a data value from bit line BL1 during write operations, and applies the stored data value to the gate terminal of transistor Q2 of comparator circuit 14. Transistor Q2 is connected in series with transistor Q3, which is controlled by a data signal transmitted on inverted data line D1# (the "#" is used herein to designate complement), between a match line (MATCH) and a discharge line (DISCHARGE). A second DRAM cell 16 includes transistor Q3 and a capacitor structure C2, which combine to form a storage node b that receives a data value from bit line BL2, and applies the stored data value to the gate terminal of transistor Q4 of comparator circuit 14. Transistor Q4 is connected in series with transistor Q5, which is controlled by a data signal transmitted on inverted data line D1#, between the match line and the discharge line.

During a data write operation (or during the write phase of a refresh operation), a data value to be stored is written to dynamic storage nodes a and b by applying appropriate voltage signals (e.g., VCC or ground) on bit lines BL1 and BL2, and then applying a high voltage signal on word lines WL1 and WL2. The high voltage on word lines WL1 and WL2 turn on transistor Q1 and Q2, thereby passing the voltage signals to dynamic storage nodes a and b. Because the voltage signals are stored using capacitors C1 and C2, the stored data value decays over time, thereby requiring refresh circuitry that periodically reads and rewrites (refreshes) the stored data value before it is lost.

The data value stored at storage nodes a and b is applied to the gate terminals of transistors Q2 and Q5 of comparator circuit 14. Comparator circuit 14 is utilized to perform match (comparison) operations by precharging a match line M and transmitting an applied data value on data lines D1 and D1# to the gate terminals of transistor Q3 and Q6, respectively. A no-match condition is detected when match line M is discharged to ground through the signal path formed by transistors Q2 and Q3, or through the signal path formed by transistors Q5 and Q6. For example, when the stored data value at node a and the applied data value transmitted on data line D1# are both logic "1", then both transistors Q2 and Q3 are turned on to discharge match line M to the discharge line (e.g., ground). When a match condition occurs, match line M remains in its pre-charged state (i.e., no signal path is formed by transistors Q2 and Q3, or transistors Q5 and Q6).

A problem with DRAM-based CAM cell 10 arises because the voltage signal (charge) stored at storage nodes a and b are directly applied to (shared with) bit lines BL1, and BL2, respectively, during read operations. Specifically, the charge stored at storage nodes a and b must be strong enough to pass through access transistors Q1 and Q4 and swing the voltage levels on bit lines BL1 and BL2 such that the stored data value can be read, for example, by a sense amplifier (not shown) connected to bit lines BL1 and BL2. To provide this sufficient capacitance, capacitor structures C1 and C2 are often constructed using a special multi-layer polysilicon fabrication process that significantly increases fabrication time and expense. In addition, because the size of these capacitor structures is limited, the length of bit lines BL1 and BL2 must be limited to avoid excessively large bit line capacitances, thereby minimizing the number of CAM cells in each column of a DRAM-based CAM array. That is, the length and, hence, the capacitance of bit lines BL1 and BL2 increases with the number of DRAM CAM cells that are connected to these lines. Specifically, the voltage swing on a bit line is inversely proportional to bit line capacitance (i.e., length). When the bit line is too long (i.e., has too high of a capacitance), then the bit line voltage swing is too small to read. Because the length of the bit lines is limited, so too are the number of DRAM cells in each column that are connected to the bit line. By limiting the number of DRAM CAM cells in each column, the number of independent blocks of DRAM memory cells is increased, thereby requiring more space for control circuitry and increasing the overall size and cost of the DRAM CAM circuit. Finally, conventional DRAM-based CAM cell 10 is limited in that a read operation can be disturbed by a simultaneous match operation performed by comparator circuit 14. When conventional DRAM cells 12 and 16 are read, the read data values are typically transmitted to associated bit lines during "quiet" periods in which switching noise in a DRAM array does not cause a loss of the read data values. However, by allowing simultaneous match operations during the read phase of the refresh operation, it is possible to lose the read data values.

Figure 1B:
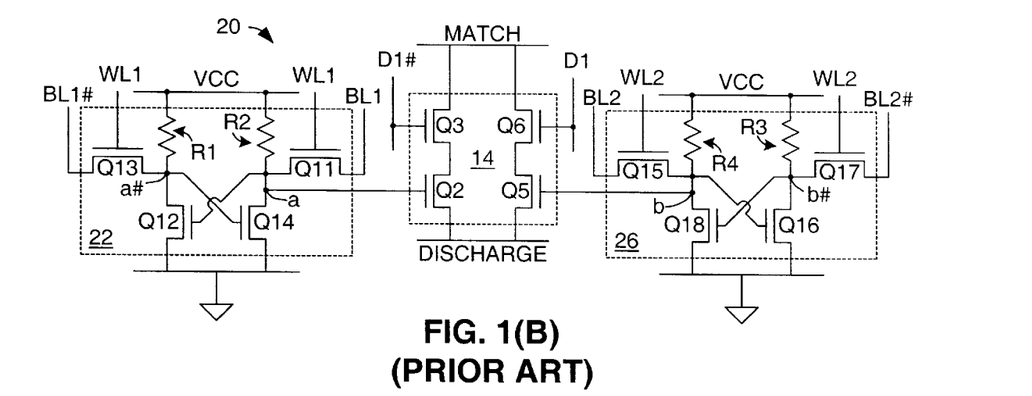
Figure 1C:
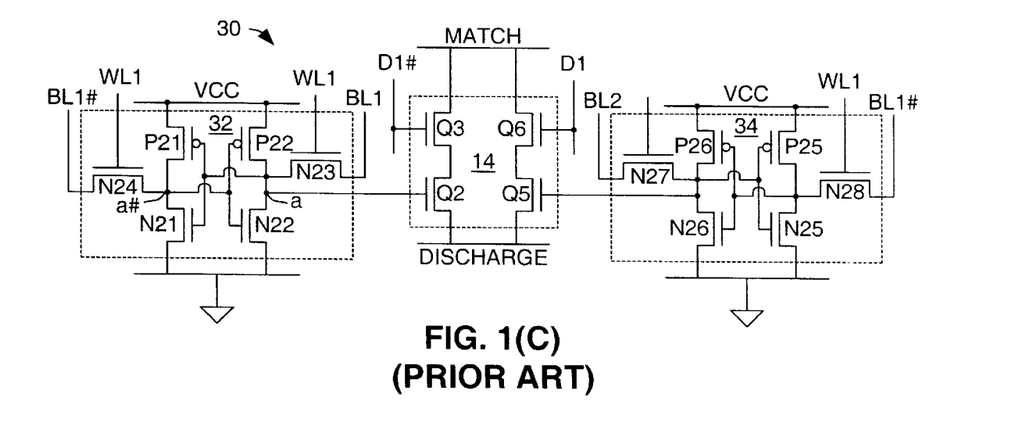

FIGS. 1(B) and 1(C) are circuit diagrams showing conventional SRAM-based CAM cells 20 and 30, respectively. In general SRAM-based CAM cells require more transistors than DRAM-based CAM cells, and are therefore typically much larger than DRAM-based CAM cell 10 (see FIG.

1(A)). In addition, SRAM-based CAM arrays typically consume more power than DRAM-based CAM arrays. However, SRAM-based CAM cells overcome the charge sharing problems associated with DRAM-based CAM cells by utilizing bistable flip flops, which are able to store data values without the refresh operation required by DRAM cells. Further, even when a stored data value is read, the bistable flip flops transmit a current onto an adjoining bit line that, over time, generates enough charge to swing the bit line to indicate the stored data value. This current-over-time approach allows SRAM-based CAM arrays to include much longer bit lines (i.e., many more SRAM cells per bit line) because bit line swing can be achieved for any bit line length, given enough current and enough time.

FIG. 1(B) shows a twelve transistor (12T) SRAM-based CAM cell 20 including two four-transistor (4T) SRAM cells 22 and 26 that apply stored data values to comparator circuit 14, which performs match operations in the manner described above with reference to FIG. 1(A). SRAM cell 22 includes access transistors Q11 and Q13 for passing data values from bit lines BL1 and BL1# to storage nodes a and a#, respectively, which apply the stored data values to pull-down transistors Q12 and Q14, respectively, thereby producing a bistable structure. Note that storage nodes a and a# are connected to VCC via resistors R1 and R2, respectively. Similarly, SRAM cell 26 includes access transistors Q15 and Q17 for passing data values from bit lines BL2 and BL2# to storage nodes b and b#, respectively, which are connected to system voltage VCC by resistors R3 and R4, and apply the stored data values to pull-down transistors Q16 and Q16, respectively.

In addition to the general problems associated with SRAM-based CAM cells mentioned above, a particular problem associated with 12T SRAM-based CAM cell 20 is that, similar to capacitor structures C1 and C2 of DRAM-based CAM cell 10 (discussed above), resistors R1 through R4 require special (i.e., non-standard) fabrication processes. These special fabrication processes significantly increase the time and cost needed to fabricate devices including SRAM-based CAM cell 20.

FIG. 1(C) shows a sixteen transistor (16T) SRAM-based CAM cell 30 including two six-transistor (6T) SRAM cells 32 and 36 that apply stored data values to comparator circuit 14. SRAM cell 32 utilizes series-connected pairs of p-channel transistors and n-channel transistors (i.e., P21 and N21, and P22 and N22) to provide pull-up and pull-down latching a data value at storage nodes a and a#, and a pair of access transistors N23 and N24 for passing the data value to storage nodes a and a# during write operations. Similarly, SRAM cell 26 utilizes series-connected pairs of p-channel transistors and n-channel transistors (i.e., P25 and N25, and P26 and N26) to latch a data value at storage nodes b and b#, and a pair of access transistors N27 and N28 for passing the data value to storage nodes b and b# during write operations.

Although 16T SRAM-based CAM cell 30 avoids the need for the resistors used in 14T SRAM-based CAM cell 20 (discussed above), the use of different transistor types (e.g., p-channel transistor P21 and n-channel transistor N21) require special layout considerations that complicate the manufacturing process and significantly increase the size of a CAM structure including several 16T SRAM-based CAM cells 30.

Accordingly, what is needed is a CAM cell that provides the size advantages of a DRAM CAM cell and the performance benefits of an SRAM CAM cell, and avoids the need for special fabrication processing and layout considerations.

SUMMARY OF THE INVENTION

The present invention is directed to DRAM-based CAM cells that overcome the problems associated with conventional CAM cells by utilizing three-transistor (3T) or four-transistor (4T) DRAM cells to store data values. Although larger than conventional 1T DRAM cells, the intrinsic capacitance of each 3T or 4T DRAM cell avoids the need for the discrete capacitor structures typically required in the 1T DRAM cells, thereby simplifying the fabrication process. Further, read operations are performed without disturbing the stored data value by, for example, applying the stored data value to the gate terminal of a pull-down transistor and detecting the operating state (i.e., turned on or turned off) of the pull-down transistor, thereby avoiding the charge sharing problems associated with 1T DRAM cells, and increasing bit line lengths (i.e., array size). Accordingly, the present invention provides CAM cells that combine cell size and power consumption characteristics similar to conventional DRAM-based CAM cells with performance and array size characteristics associated with conventional SRAM-based CAM cells, and avoids the need for special fabrication processes.

In accordance with a first specific embodiment of the present invention, a ten transistor (10T) DRAM-based ternary CAM cell includes a pair of 3T DRAM cells for storing first and second data values, and a four transistor comparator circuit that discharges a match line when either of the first and second data values fails to match and applied data value (and its complement) provided from an external source. Each 3T DRAM cell includes a write (first) transistor connected between a write (first) bit line and a storage node of the 3T DRAM cell, and a pull-down (second) transistor connected in series with a read (third) transistor between a read (second) bit line and ground. A gate terminal of the pull-down transistor is connected to the storage node, which is also connected to a first input terminal of the comparator circuit. The capacitance of the storage node is produced by the metal lines and polysilicon structures connecting the write transistor and the pull-down transistor to the first input terminal of the comparator circuit. Similar to a conventional 1T DRAM cell, a data value is written to the storage node of a selected 3T DRAM cell by turning on the write transistor and transmitting the data value from the write bit line to the storage node. However, instead of disturbing the stored data value during read operations, as in conventional 1T DRAM cells, the stored data value is indirectly "read" by detecting the operating state (i.e., turned on or turned off) of the pull-down transistor, which is controlled by the stored data value. When the stored data value is in a first logic state, (e.g., logic "1" or high), the pull-down transistor is turned on, and the read bit line is pulled to ground through the pull-down transistor. Conversely, when the stored data value is in a second logic state (e.g., logic "0" or low), the pull-down transistor remains turned off, and the read bit line does not change. In either case, the data value stored by the 3T DRAM cell is not disturbed, thereby allowing a simultaneous comparison operation using the comparator circuit according to known techniques.

In accordance with a second specific embodiment of the present invention, a twelve transistor (12T) ternary CAM cell includes a pair of 4T DRAM cells for storing data values, and a four-transistor comparator circuit. Each 4T DRAM cell includes a first access transistor connected between a first bit line and a primary storage node, a second access transistor connected between a second bit line and an inverted (secondary) storage node, a first pull-down transistor connected between the inverted storage node and ground and having a gate terminal connected to the primary storage node, and a second pull-down transistor connected between the primary storage node and ground and having a gate terminal connected to the secondary storage node. Refresh operations are performed in a single step by turning on the first and second access transistors and transmitting high voltages on the first and second bit lines, thereby simplifying the control circuitry needed to drive a CAM array incorporating the 12T ternary DRAM cell.

In accordance with a third specific embodiment of the present invention, a nine, eleven, or twelve transistor quad CAM cell includes a single 4T DRAM cell for storing data values, a four transistor comparator circuit, and a one, three or four transistor masking DRAM cell. The 4T DRAM cell is similar to that used in the second embodiment (described above), but relatively high operating voltage is required to selectively store logic high data values in the primary and secondary storage nodes, which are connected to the gate terminals of first and second transistors in the comparator circuit. The first and second transistors of the comparator circuit have relatively thick gate oxides to support the relatively high gate voltages applied from the storage nodes, and to pass applied data values to the gate of a third transistor, which is connected in series with a fourth transistor controlled by the masking DRAM cell between match and discharge lines. The masking DRAM cell is utilized to perform "don't care" operations while allowing the 4T DRAM cell to store original data values.

In accordance with a fourth specific embodiment of the present invention, a ten, twelve, or thirteen transistor quad CAM cell includes a single 4T DRAM cell for storing data values, a five transistor comparator circuit, and a one, three or four transistor masking DRAM cell. Although larger than the quad CAM cell of the third embodiment, the fourth embodiment avoids the need for transistors having thick gate oxides and relatively high operating voltages, thereby simplifying the fabrication process.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 2:
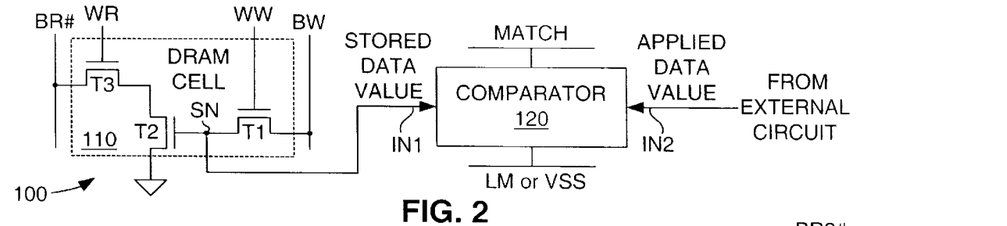
FIG. 2 is a simplified schematic diagram showing a DRAM-based CAM cell utilizing a 3T DRAM cell according to a first embodiment of the present invention.

FIG. 2 is a simplified schematic diagram showing a DRAM-based CAM cell. 100 in accordance with a first embodiment of the present invention. DRAM-based CAM cell 100 includes a three-transistor (3T) dynamic random access memory (DRAM) cell 110 for storing a data value that is applied to a first input terminal IN1 of a comparator circuit 120. DRAM cell 110 includes a capacitive storage node SN, a write (first) transistor T1 connected between storage node SN1 and a write (first) bit line BW, a pull-down (second) transistor T2 having a gate terminal connected to storage node SN, and a read (third) transistor T3 connected in series with pull-down transistor T2 between a read (second) bit line BR and ground (or other voltage source). Comparator circuit 120 compares the data value stored in storage node SN with an applied data value received from an external source (e.g., a microprocessor or other circuit), and discharges a match line to a discharge line when the stored data value fails to match the applied data value.

In accordance with a first aspect of the present invention, storage node SN is formed by intrinsic capacitance produced at the junction of conductive (e.g., metal) lines connecting read transistor T1 to the gate terminal of pull-down transistor T2 and to first input terminal IN1 of comparator circuit 120, and by the (e.g., polysilicon) gate structure of pull-down transistor T2. This intrinsic capacitance is sufficient to avoid the need for a discrete capacitor structure that typically requires a complex, triple layer polysilicon fabrication process. Accordingly, although 3T DRAM cell 110 is larger than a conventional 1T DRAM cell, the fabrication process required to produce 3T DRAM cell 110 is less complex than that required to produce conventional 1T DRAM cells.

In accordance with a second aspect of the present invention, 3T DRAM cell 110 is read using a current-overtime read operation typically associated with conventional SRAM cells that prevents disturbing storage node SN, thereby facilitating simultaneous read and compare (match) operations and facilitating increased bit line lengths (i.e., larger arrays). As discussed in the background section (above), all DRAM cells require a refresh operation to maintain stored data. These refresh operations typically involve reading the stored data value from the DRAM cell, and then writing (refreshing) the stored data value in the DRAM cell. Because this read operation is performed in conventional 1T DRAM cells by directly accessing the storage node (i.e., by turning on a transistor connected between the storage node and a read bit line), the stored data value (i.e., the voltage level at the storage node) can be disturbed (i.e., discharged or otherwise changed), thereby potentially generating an erroneous compare (match) operation that is performed simultaneously with the read operation. Further, this direct access requires relatively short bit lines (to minimize capacitance), thereby producing relatively small array blocks. To avoid these problems, the data value stored at storage node SN of 3T DRAM cell 110 is read indirectly (i.e., by utilizing the stored data value to control a signal path that does not pass through the storage node). In the disclosed embodiment, this indirect read operation is performed by applying the stored data value to the gate terminal of pull-down transistor T2, and then turning on read transistor T3. When the stored data value is in a logic "1" (high voltage) state, the pull-down transistor is turned on and read bit line BR# is pulled to ground (the symbol "#" is utilized herein to denote a complementary data value). Conversely, when the stored data value is in a logic "0" (low voltage) state, the pull-down transistor is turned off and read bit line BR# is unchanged from a pre-charged state. In either case, because the stored data value is applied only to the gate terminal of pull-down transistor T2, the stored data value is not disturbed during the read operation because not current flows to or from storage node SN. Accordingly, the read (refresh) operation can be simultaneously performed with a compare (match) operation by compare circuit 120, thereby facilitating an optimal operating speed. Further, because the read operation is less affected by bit line capacitance, relatively long bit lines can be used, thereby increasing the size of an array (not shown) of CAM cells 100.

In other embodiments (not shown), the pre-charging of read bit line BR# may be omitted, and a static pull-up device may be utilized in accordance with known techniques.

Figure 3A:
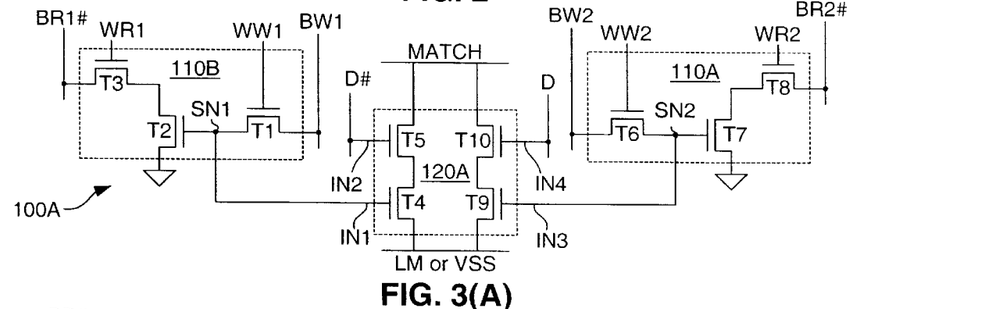
FIGS. 3(A), 3(B) and 3(C) are schematic diagrams showing 10T DRAM-based ternary CAM cells according to specific embodiments of the CAM cell shown in FIG. 2.

FIG. 3(A) is a schematic diagram showing a ten transistor (10T) DRAM-based ternary CAM cell 100A according to a first specific embodiment of the present invention. CAM cell 100A includes a first 3T DRAM cell 110A, a second 3T DRAM cell 100B, and a four transistor comparator circuit 120A. 3T DRAM cell 110A is essentially identical to DRAM cell 100 (shown in FIG. 2), and is controlled during read and write operations by a write (first) word line WW1, a read (second) word line WR1 to transmit a predetermined stored data value to input terminal IN1 of comparator circuit 120A. Comparator circuit 120 includes a fourth transistor T4 connected in series with a fifth transistor T5 between the match line and the discharge line (LM or VSS), with the gate terminal of fourth transistor T4 being connected to first input terminal IN1, and the gate terminal of fifth transistor T5 forming a second input terminal IN2 for receiving an (inverted) applied data value on inverted data line D#. Similar to 3T DRAM cell 110A, 3T DRAM cell 110B includes a write (sixth) transistor T6 connected between a write (third) bit line BW2 and a second storage node SN2, a pull-down (seventh) transistor T7 having a gate terminal connected to second storage node SN2, and a read (eighth) transistor T8 connected in series with pull-down transistor T7 between a read (fourth) bit line BR2# and ground. Comparator circuit 120 also includes a ninth transistor T9 connected in series with a tenth transistor T10 between the match line and the discharge line, with the gate terminal of ninth transistor T9 forming a third input terminal IN3 that is connected to second storage node SN2, and the gate terminal of tenth transistor T10 forming a fourth input terminal IN4 for receiving an applied data value on data line D.

In accordance with yet another aspect of the present invention, all transistors T1–T10 of CAM cell 10A are formed using one type (e.g., NMOS) of transistor. The present invention further facilitates non-complex fabrication processes by providing a CAM structure in which all of the transistors are the same type (i.e., either all NMOS or all PMOS transistors), thereby avoiding layout complexities associated with CAM cells utilizing both of these types of transistors.

A data value is initially written to 3T DRAM cells 110A and 110B during a write operation by transmitting a high write signal on write word lines WW1 and WW2, thereby turning on write transistors T1 and T6, and transmitting the desired data value on write bit lines BW1 and BW2. For example, a logic "1" is written to CAM cell 100A by passing a high voltage from write bit line BW1 through write transistor T1 to storage node SN1, and a low voltage from write bit line BW2 through write transistor T6 to storage node SN2. Conversely, a logic "0" is written to CAM cell 101A by passing a low voltage from write bit line BW1 through write transistor T1 to storage node SN1, and a high voltage from write bit line BW2 through write transistor T6 to storage node SN2. A "don't care" logic value is written to CAM cell 100A by passing low voltages from write bit lines BW1 and BW2 to storage nodes SN1 and SN2.

During subsequent refresh operations, the data value stored at storage nodes SN1 and SN2 is read and then re-written to 3T DRAM cells 110A and 110B. As described above, the data value is indirectly read from storage nodes SN1 and SN2 by turning on read transistors T3 and T8, and then detecting the resulting voltage (or current) on read bit lines BR1# and BR2#. In one embodiment, read bit lines BR1# and BR2# are pre-charged at the beginning of the read operation. Subsequently, when read transistors T3 and T8 are turned on by high control signals transmitted on read word lines WR1 and WR2, the voltage levels on read bit lines BR1# and BR2# are affected by the operating state of pull-down transistors T2 and T7 (i.e., by detecting a voltage across pull-down transistors T2 and T7). When a logic "1" is stored in 10T CAM cell 100A, the high voltage at storage node SN1 causes read bit line BR1# to be pulled low through pull-down transistor T2, and the low voltage at storage node SN2 causes read bit line BR2# to remain in the pre-charged state (i.e., pull-down transistor T7 remains turned off). Conversely, when a logic "0" is stored, the low voltage at storage node SN1 causes read bit line BR1# to remain in the pre-charged state, and the high voltage at storage node SN2 causes read bit line BR2# to be pulled low through pull-down transistor T7. When a "don't care" data value is stored in 10T CAM cell 100A, the low voltages at storage nodes SN1 and SN2 cause both read bit lines BN1# and BN2# to remain in the pre-charged state. During the subsequent write phase of the refresh operation, the logic values on read bit lines BR1# and BR2# are inverted and written back to storage nodes SN1 and SN2 in accordance with the write operation described above.

As mentioned above, because the stored data values are indirectly read during refresh operations, compare circuit 120A is able to simultaneously perform compare (match) operations without error. These compare operations involve discharging the match line to the discharge line through either a first signal path formed by transistors T4 and T5, or a second signal path formed by transistor T9 and T10 when a logic "1" or logic "0" stored data value fails to match the applied data value transmitted on data line D and inverted data line D#. For example, when a logic "1" is stored in CAM cell 100A, the high voltage at storage node SN1 turns on transistor T4, and the low voltage at storage node SN2 turns off transistor T7. Note that a discharge path through transistors T9 and T10 is not possible due to the low voltage at storage node SN2. In this state, when a logic "0" is applied (i.e., a low voltage is transmitted on data line D and a high voltage is transmitted on inverted data line D#), then transistor T5 is also turned on and the match line is discharged. Conversely, when the applied data value is a logic "1" (i.e., a high voltage is transmitted on data line D and a low voltage is transmitted on inverted data line D#), then transistor T5 remains turned off and the match line remains in a pre-charged state (i.e., assuming no other CAM cells in the row including CAM cell 100A detect no-match conditions). When a logic "0" is stored in CAM cell 100A, the high voltage at storage node SN2 turns on transistor T4, and the low voltage at storage node SN2 turns off transistor T7. Note that a discharge path through transistors T4 and T5 is not possible due to the low voltage at storage node SN1. In this state, when a logic "0" is applied, then transistor T10 is turned off and the match line is remains charged. Conversely, when the applied data value is a logic "1", then transistor T10 is turned on and the match line discharges through transistors T9 and T10. When a "don't care" data value is stored in CAM cell 10A, then the low voltage stored at storage nodes SN1 and SN2 turns off transistors T4 and T9, respectively, thereby preventing discharge of the match line when either a logic "1" or a logic "0" is applied.

In one embodiment, the discharge (LM or low match) line is maintained at a predetermined low voltage (e.g., VSS) during compare operations, and is maintained in a floating state by a match line control circuit (not shown) during read and write operations to reduce power consumption. In another embodiment, the discharge line is constantly maintained at a predetermined low voltage (e.g., VSS).

Figure 3B:
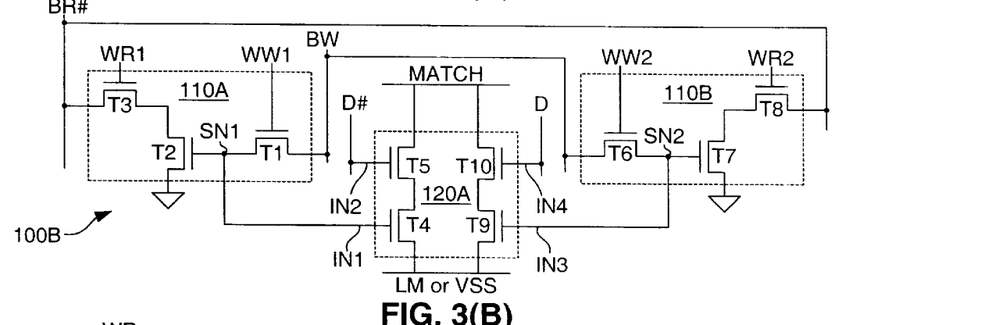
Figure 3C:
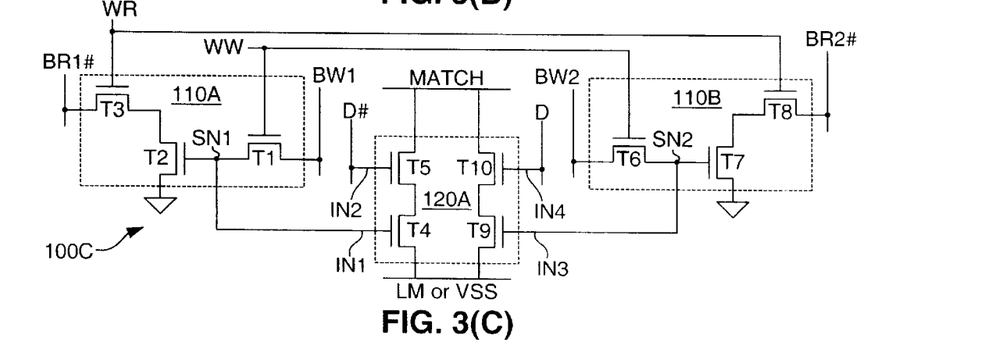

FIGS. 3(B) and 3(C) respectively show 10T DRAM-based CAM cells 100B and 100C that include 3T DRAM cells 110A and 110B and comparator circuit 120A, but provide alternative bit line and word line arrangements. Referring to FIG. 3(B), CAM cell 100B includes a single write bit line BW (i.e., in place of separate write bit lines BW1 and BW2 shown in FIG. 3(A)) for transmitting data values through write transistors T1 and T6 during , and includes a single read bit line BR# for controlling read transistors T3 and T8 (i.e., in place of separate read bit lines BR1# and BR2# shown in FIG. 3(A)). Replacing the four bit lines of CAM cell 100A with bit lines BW and BR# reduces the size of CAM cell 100B by reducing the space needed to provide the metal lines, but requires read/write operations to be performed in two stages (i.e., one stage for each DRAM cell 110A and 110B), thereby requiring a relatively complex control circuit (not shown). Similarly, CAM cell 100C (FIG. 3(C)) includes a single write word line WW for controlling write transistors T1 and T6 (i.e., in place of separate write word lines WW1 and WW2 shown in FIG. 3(A)), and includes a single read word line WR for controlling read transistors T3 and T8 (i.e., in place of separate read bit lines BR1# and BR2# shown in FIG. 3(A)). Similar to the benefit provided by CAM cell 101B, replacing the four word lines of CAM cell 100A with word lines WW and WR reduces the size of CAM cell 100C. Further, CAM cell 100C can be read and written in a single stage.

Figure 4:
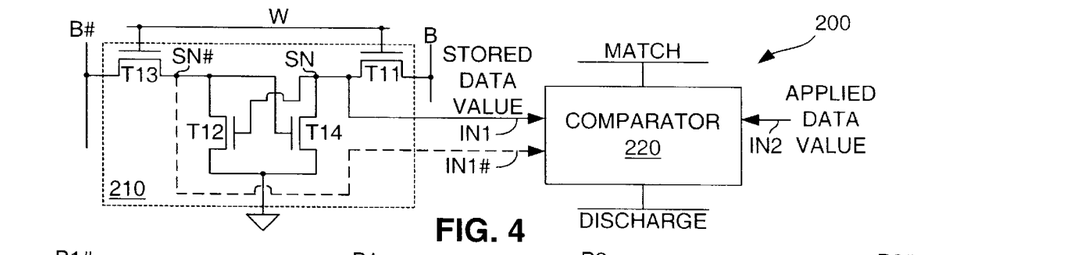
FIG. 4 is a simplified schematic diagram showing a DRAM-based CAM cell utilizing a 4T DRAM cell according to a second embodiment of the present invention.

FIG. 4 is a simplified schematic diagram showing a DRAM-based CAM cell 200 in accordance with a second embodiment of the present invention. CAM cell 200 includes a four-transistor (4T) dynamic random access memory (4T DRAM) cell 210 for storing a data value that is applied to a first input terminal IN1 of a comparator circuit 220. 4T DRAM cell 210 includes a first access transistor T11, a first pull-down transistor T12, a second access transistor T13 that are connected together in a manner consistent with transistors T1, T2 and T3 of CAM cell 100 (discussed above with reference to FIG. 2). Specifically, first access transistor T11 (corresponding to write transistor T1) is connected between a first bit line B and a primary storage node SN, second access transistor T13 (corresponding to read transistor T3) is connected between a second bit line B# and an inverted (secondary) storage node B1#, and first pull-down transistor T12 (corresponding to pull-down transistor T2) is connected between inverted storage node SN# and ground, and has a gate terminal connected to primary storage node SN. Note that a single word line W is utilized to control both access transistors T11 and T13.

In accordance with another aspect of the present invention, 4T DRAM cell 210 also includes a second pull-down transistor T14 that avoids separate read and write operations during refresh, thereby simplifying the control circuitry (not shown) needed to operate CAM cell 200. Second pull-down transistor T14 is connected between primary storage node SN and ground, and has a gate terminal connected to secondary storage node SN#. Note that secondary storage node SN# is formed by intrinsic capacitance produced at the junction of conductive (e.g., metal) lines connecting second access transistor T13 to the gate terminal of second pull-down transistor T14 and to first pull-down transistor T12, and by the (e.g., polysilicon) gate structure of second pull-down transistor T14. Read and write operations are performed in a manner similar to corresponding 3T DRAM cell operations, described above. However, refresh operations are performed in a single step by pre-charging bit lines B and B# to a logic high (e.g., VCC) state, and then turning on access transistors T11 and T13, thereby connecting the pre-charged bit lines B and B# to storage nodes SN and SN#, respectively. When a logic "1" is stored in 4T DRAM cell 210 (i.e., a high voltage at primary storage node SN and a low voltage at secondary storage node SN#), primary storage node SN is refreshed by the pre-charged bit line B (note that pull-down transistor T14 is turned off by the low voltage at secondary storage node SN#), and causes bit line B# to discharge through pull-down transistor T12, thereby refreshing the low voltage at secondary storage node SN#. Conversely, when a logic "0" is stored (i.e., a low voltage at primary storage node SN and a high voltage at secondary storage node SN#), secondary storage node SN# is refreshed by the pre-charged bit line B#, and causes bit line B to discharge through pull-down transistor T14, thereby refreshing the low voltage at primary storage node SN. Accordingly, although 4T DRAM cell 210 is larger than 3T DRAM cell 110 (described above) due to the second pull-down transistor T14, 4T DRAM cell 210 is refreshed in a single step (i.e., without separate read and write operations), thereby allowing less complex (and, hence, smaller) CAM control circuitry (not shown).

Similar to comparator circuit 120 of 3T DRAM cell 110 (discussed above), a data value stored at primary storage node SN is not discharged during the single step refresh operation, thereby facilitating simultaneous refresh and compare operations. Specifically, a partially-decayed logic high value stored at primary storage node SN is connected to a fresh high logic value on bit line B during the refresh operation, so the logic high value applied to first input terminal IN1 remains high. Conversely, a logic low value stored at primary storage node SN remains low during the refresh operation due to the high voltage level applied to the gate terminal of pull-down transistor T14 from secondary storage node SN#, so the logic low value applied to first input terminal IN1 remains low. Accordingly, in either instance, comparator circuit 220 is able to perform compare operations simultaneously with the refresh operations because the data value data value received from primary storage node SN is not disturbed during refresh.

Figure 5A:
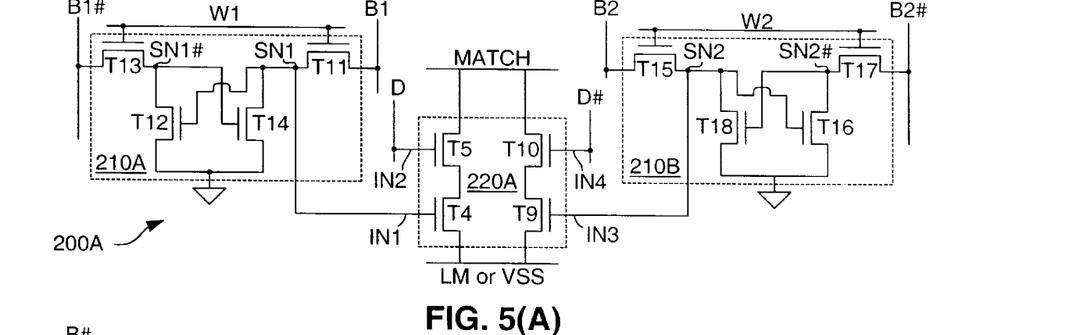
FIGS. 5(A), 5(B) and 5(C) are schematic diagrams showing 12T DRAM-based ternary CAM cells according to specific embodiment of the CAM cell shown in FIG. 4.

FIG. 5(A) is a schematic diagram showing a twelve transistor (12T) DRAM-based ternary CAM cell 200A according to another specific embodiment of the present invention. CAM cell 200A includes a first 4T DRAM cell 210A, a second 4T DRAM cell 210B, and a four transistor comparator circuit 220A that is essentially identical to comparator circuit 120A (described above). 4T DRAM cells 210A and 210B are essentially identical to DRAM cell 200 (shown in FIG. 4), and are controlled during read, write, and refresh operations by a first word line W1 and a second word line W2, respectively. Similar to 4T DRAM cell 210A, 4T DRAM cell 210B includes a first access (seventh) transistor T15 connected between a (third) bit line B2 and a second primary storage node SN2, a pull-down (eighth) transistor T16 connected between a secondary storage node SN2# and ground and having a gate terminal connected to primary storage node SN2, a second access (ninth) transistor T17 connected between a (fourth) bit line B2# and secondary storage node SN2#, and a second pull-down transistor T18 connected between primary storage node SN2 and ground and having a gate terminal connected to secondary storage node SN2#. Third input terminal IN3 of comparator circuit 220A is connected to primary storage node SN2.

Data values are written to 4T DRAM cells 210A and 210B in a manner similar to the write operation described above with reference to the 3T DRAM cells. However, during a write operation, both access transistors T11 and T13 are turned on and complementary data values are transmitted on bit lines B and B#. For example, a logic "1" is written to CAM cell 200A by passing a high voltage on write bit lines B1 and B2# through access transistors T11 and T17 to storage nodes SN1 and SN2#, respectively, and passing a low voltage from bit lines B1# and B2 through access transistors T13 and T15 to storage nodes SN1# and SN2, respectively.

Conversely, a logic "0" is written to CAM cell 200A by passing a low voltage on write bit lines B1 and B2# through access transistors T11 and T17 to storage nodes SN1 and SN2#, respectively, and passing a high voltage from bit lines B1# and B2 through access transistors T13 and T15 to storage nodes SN1# and SN2, respectively. A "don't care" logic value is written to CAM cell 200A by passing low voltages from bit lines B1 and B2 to primary storage nodes SN1 and SN2, and high voltages from bit lines B1# and B2# to secondary storage nodes SN1# and SN2#.

During subsequent refresh operations, the data value stored at primary storage nodes SN1 and SN2 and secondary storage nodes SN1# and SN2# are refreshed in 4T DRAM cells 210A and 210B in the manner described above with reference to FIG. 4. As mentioned above, because these stored data values are refreshed without disturbance, compare circuit 220A is able to simultaneously perform compare (match) operations in the manner described above.

Figure 5B:
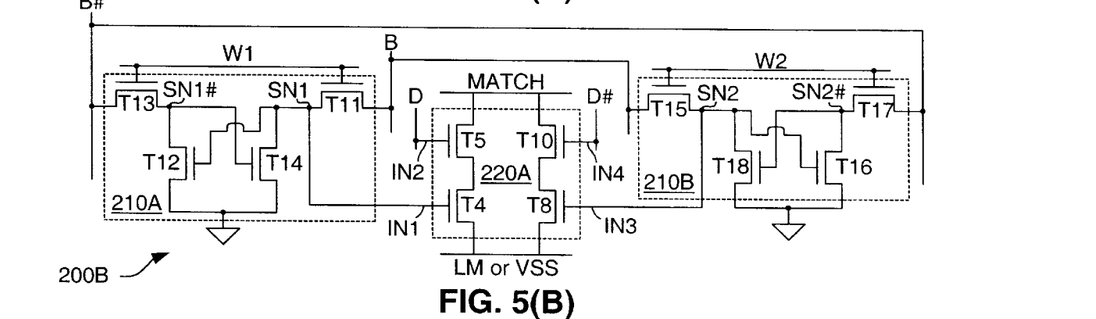
Figure 5C:
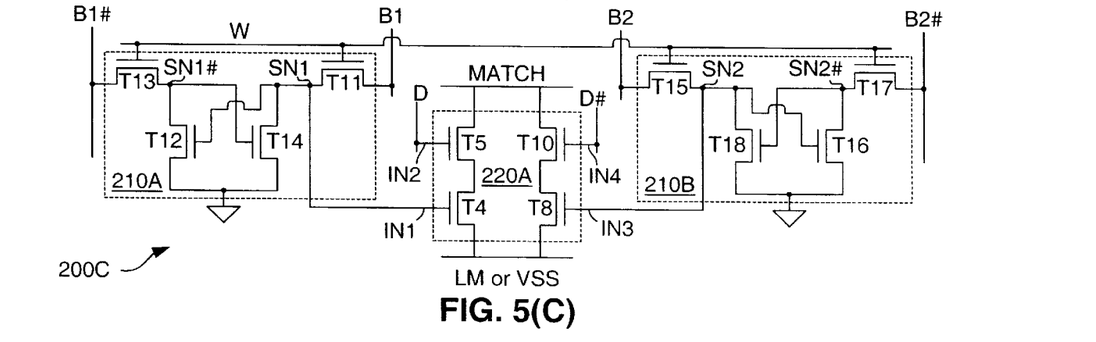

FIGS. 5(B) and 5(C) respectively show 12T DRAM-based CAM cells 200B and 200C that include 4T DRAM cells 210A and 210B and comparator circuit 220A, but provide alternative bit line and word line arrangements. Referring to FIG. 5(B), CAM cell 200B includes a single bit line B in place of separate write bit lines B1 and B2 shown in FIG. 5(A), and a single bit line B# in place of separate read bit lines B1# and B2# shown in FIG. 5(A). Referring to FIG. 5(C), CAM cell 200C includes a single word line W in place of separate word lines W1 and W2 shown in FIG. 5(A). The benefits of these alternative embodiments are similar to those described above with reference to FIGS. 3(B) and 3(C).

Figure 6:
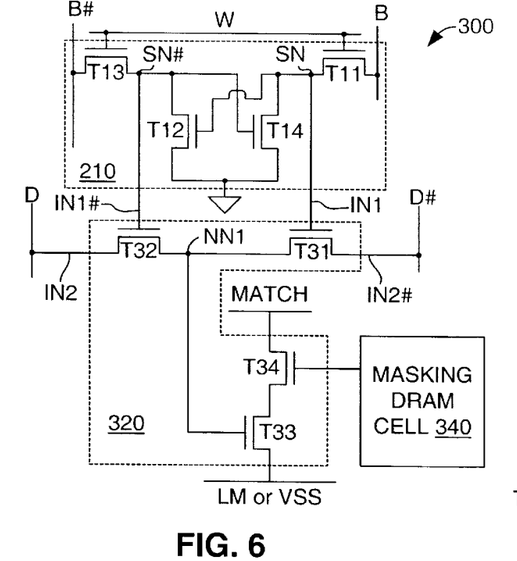
FIG. 6 is schematic diagram showing a DRAM-based quad CAM cell according to a third embodiment of the present invention.

FIG. 6 shows a DRAM-based quad CAM cell 300 according to a third embodiment of the present invention. DRAM-based quad CAM cell 300 includes 4T DRAM cell 210, a comparator circuit 320, and a masking DRAM cell 340.

4T DRAM cell 210 is essentially identical to that described above with reference to FIG. 4, but includes an additional conductor extending from secondary storage node SN# to an inverting input terminal IN1# of comparator circuit 320. In addition, relatively high positive voltages are stored by 4T DRAM cell 210, which are required to turn on a first transistor T31 and a second transistor T32 of comparator circuit 320, as described below.

Comparator circuit 320 compares the data values stored in storage nodes SN and SN# with an applied data value transmitted on data line D and inverted data line D#, and discharges a match line to a discharge line when the stored data value fails to match the applied data value. Comparator circuit 320 includes first transistor T31 connected between inverted data line D# and an intermediate node NN1, second transistor T32 connected between data line D and intermediate node NN1, a third transistor T33 having a gate terminal connected to the intermediate node NN1, and a fourth transistor T34 connected in series with transistor T33 between the match line and the discharge (LM or VSS) line. First transistor T31 and second transistor T32 are formed with relatively thick gate oxides to support the relatively high voltages applied from 4T DRAM cell 310. Specifically, the relatively high voltages and thick gate oxides are required to turn on first transistor T31 and second transistor T32 such that a high voltage passed by one of these transistors has sufficient strength to turn on third transistor T33.

Masking DRAM cell 340 stores a care/don't care value that is applied to the gate terminal of transistor T34. As discussed below, in alternative embodiments masking DRAM cell 340 is a 1T, 3T or 4T DRAM cell.

During compare operations, a data value stored in storage nodes SN and SN# controls transistors T31 and T32, which pass a high voltage signal from one of data line D and inverted data line D# to the gate terminal of transistor T33 when the stored data value fails to match the applied data value. When a mismatch occurs and masking DRAM cell 340 stores a care (logic "1" or high) value, then the match line is discharged. Conversely, the match line is not discharged when a match occurs or when masking DRAM cell 340 stores a don't care (logic "0" or low) value. Accordingly, masking DRAM cell 340 facilitates "don't care" operations while allowing 4T DRAM cell 210 to store original data values (i.e., not "don't care" values), thereby allowing CAM cell 300 to perform "quad" CAM functions.

Figure 7A:
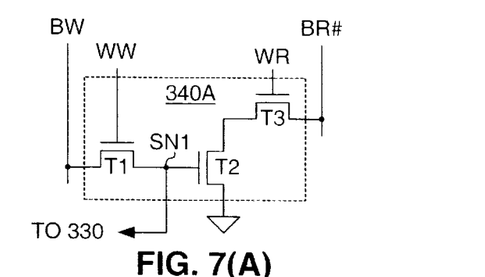
FIGS. 7(A) and 7(B) are schematic diagrams showing 3T and 4T DRAM masking cells that are alternatively incorporated in the DRAM-based quad CAM cell of FIG. 6.
Figure 7B:
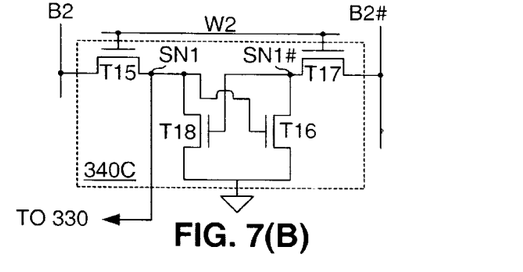

FIGS. 7(A) and 7(B) show alternative 3T and 4T masking DRAM cells 340A and 340B that can be alternatively used in CAM cell 300 (FIG. 6). FIG. 7(A) shows a 3T masking DRAM cells 340A that is essentially identical to 3T DRAM cell 110, which is described above with reference to FIG. 2. FIG. 7(B) shows a 4T masking DRAM cells 340B that is essentially identical to 4T DRAM cell 210, which is described above with reference to FIG. 4. Either of these DRAM cells can be utilized as masking DRAM cell 340 in CAM cell 300 to produce 11T and 12T DRAM-based CAM cells, respectively. Alternatively, a 1T DRAM cell, similar to that shown in prior art FIG. 1(A) (discussed above) can be utilized as masking DRAM cell 340 in CAM cell 300 to produce 9T DRAM-based CAM cell. However, such a 9T DRAM-based CAM cell would require the formation of a polysilicon capacitor structure.

Figure 8:
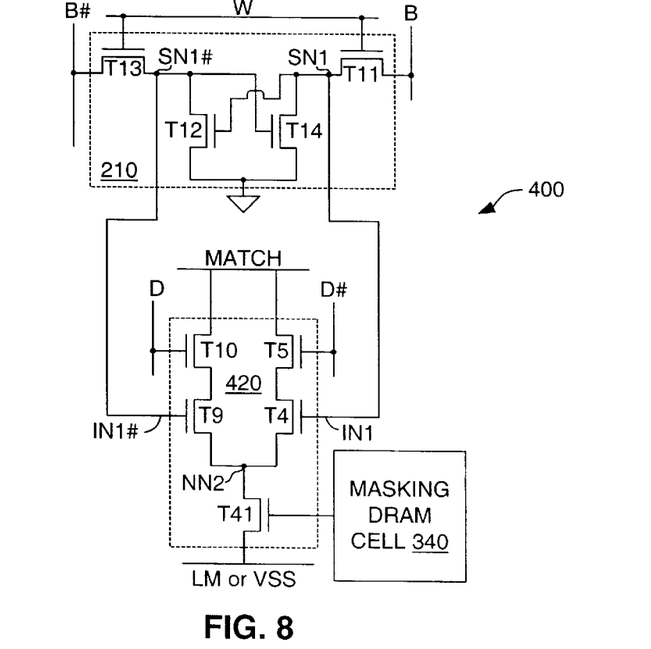
FIG. 8 is schematic diagram showing a DRAM-based quad CAM cell according to a fourth embodiment of the present invention.

FIG. 8 shows a DRAM-based quad CAM cell 400 according to a fourth embodiment of the present invention. DRAM-based quad CAM cell 400 includes 4T DRAM cell 210, a five-transistor comparator circuit 320, and a masking DRAM cell 340. 4T DRAM cell 210 is similar to that described above with reference to FIG. 6, but does not require a relatively high operating voltage. Comparator circuit 420 includes transistor T4, T5, T9 and T10 that form discharge paths between the match line and an intermediate node NN2 in a manner similar to that described above with reference to comparator 120A (see FIG. 3(A)). In addition, comparator circuit 420 includes a fifth transistor T41 connected between intermediate node NN2 and the discharge (LM or VSS) line. Unlike the third embodiment shown in FIG. 6, all of the transistors of comparator circuit 420 can be formed with the same gate oxide thickness. As in the third embodiment shown in FIG. 6, masking DRAM cell 340 stores a care/don't care value that is applied to the gate terminal of transistor T41, and in alternative is a 1T, 3T or 4T DRAM cell, as described above.

During compare operations, a discharge path is opened between the match line and intermediate node NN2 when the applied data value fails to match the data value stored in storage nodes SN and SN# in the manner described above. When a mismatch occurs and masking DRAM cell 340 stores a care (logic "1" or high) value, then the match line is discharged through transistor T41. Conversely, the match line is not discharged when a match occurs or when masking DRAM cell 340 stores a don't care (logic "0" or low) value.

Although the present invention is described with reference to certain specific embodiments, several additional alternative embodiments are also possible. For example, in another embodiment the match line may be charged (instead of discharged) when mismatches occur by reversing the pre-charges applied to the match and discharge lines. Further, the pull-down transistors may be replaced with pull-up transistors that are connected between a high voltage source (e.g., VCC) and the read/access transistors. In view of these and other possible modifications, the invention is limited only by the following claims.

What is claimed is:

1. A content addressable memory (CAM) cell including a dynamic random access memory (DRAM) cell for storing a first data value, and a comparator circuit for discharging a match line to a discharge line when the first data value fails to match an applied data value, wherein the DRAM cell comprises:

a first transistor connected between a storage node and a first bit line;

a second transistor having a gate terminal connected to the storage node, and a first terminal connected to ground; and a third transistor connected between a second terminal of the second transistor and a second bit line, wherein the storage node is connected to a first input terminal of the comparator circuit.

2. The CAM cell according to claim 1, wherein the first storage node comprises intrinsic capacitance produced by metal lines connecting the first and second transistors to the first input terminal of the comparator circuit, and by a polysilicon gate structure of the second transistor.

3. The CAM cell according to claim 1, wherein the comparator circuit comprises a fourth transistor connected in series with a fifth transistor between the match line and the discharge line, wherein a gate terminal of the fourth transistor is connected to the first input terminal, and wherein a gate terminal of the fifth transistor comprises a second input terminal for receiving the applied data value.

4. The CAM cell according to claim 3, further comprises a second DRAM cell having a second storage node for storing a second data value, wherein the second DRAM cell includes:

a sixth transistor connected between a second storage node and a third bit line and having a gate terminal controlled by a third word line;

a seventh transistor having a gate terminal connected to the second storage node, and a first terminal connected to ground; and an eighth transistor connected between a second terminal of the seventh transistor and a fourth bit line, wherein the second storage node is connected to a third input terminal of the comparator circuit.

5. The CAM cell according to claim 4, wherein the comparator circuit comprises a ninth transistor connected in series with a tenth transistor between the match line and the discharge line, wherein a gate terminal of the ninth transistor is connected to the third input terminal, and wherein a gate terminal of the tenth transistor comprises a fourth input terminal for receiving an inverted applied data value.

6. The CAM cell according to claim 4, wherein a gate terminal of the first transistor is connected to a first word line, wherein a gate terminal of the third transistor is connected to a second word line, wherein a gate terminal of the sixth transistor is connected to a third word line, and wherein a gate terminal of the eighth transistor is connected to a fourth word line.

7. The CAM cell according to claim 4, wherein the first bit line and the third bit line are connected to form a write bit line that is connected to both the first transistor and the sixth transistor, and wherein the second bit line and the fourth bit line are connected to form a read bit line that is connected to both the third transistor and the eighth transistor.

8. The CAM cell according to claim 4, wherein a gate terminal of the first transistor and a gate terminal of the third transistor are connected to a write word line, and wherein a gate terminal of the sixth transistor and a gate terminal of the eighth transistor are connected to a read word line.

9. The CAM cell according to claim 1, wherein the DRAM cell further comprises a fourth transistor connected between the storage node and the voltage source, wherein the DRAM cell includes a second storage node located between the second and third transistors, wherein the fourth transistor has a gate terminal connected to the second storage node, and wherein the first word line and the second word line are connected to form a first word conductor.

10. The CAM cell according to claim 9, wherein the second storage node comprises intrinsic capacitance produced by metal lines connecting the second and third transistors and a polysilicon gate structure of the fourth transistor.

11. The CAM cell according to claim 9, wherein the comparator circuit comprises a fifth transistor connected in series with a sixth transistor between the match line and the discharge line, wherein a gate terminal of the fifth transistor is connected to the first input terminal, and wherein a gate terminal of the sixth transistor comprises a second input terminal for receiving the applied data value.

12. The CAM cell according to claim 9, further comprises a second DRAM cell having a third storage node for storing a second data value, wherein the second DRAM cell includes:

a seventh transistor connected between a third storage node and a third bit line;

an eighth transistor having a gate terminal connected to the second storage node, a first terminal connected to ground, and a second terminal connected to a fourth storage node;

a ninth transistor connected between the fourth storage node and a fourth bit line; and a tenth transistor connected between the third storage node and ground, wherein the third storage node is connected to a third input terminal of the comparator circuit.

13. The CAM cell according to claim 12, wherein the comparator circuit comprises an eleventh transistor connected in series with a twelfth transistor between the match line and the discharge line, wherein a gate terminal of the eleventh transistor is connected to the third input terminal, and wherein a gate terminal of the twelfth transistor comprises a fourth input terminal for receiving an inverted applied data value.

14. The CAM cell according to claim 12, wherein a gate terminal of the first transistor and a gate terminal of the third transistor are connected to a first word line, and wherein a gate terminal of the seventh transistor and a gate terminal of the ninth transistor are connected to a second word line.

15. The CAM cell according to claim 12, wherein the first bit line and the third bit line are connected to form a first bit conductor that is connected to both the first transistor and the seventh transistor, and wherein the second bit line and the fourth bit line are connected to form a second bit conductor that is connected to both the third transistor and the ninth transistor.

16. The CAM cell according to claim 12, the third transistor, the seventh transistor, and the ninth transistor are connected to a word line.

17. The CAM cell according to claim 9, wherein the comparator circuit comprises:

a fifth transistor connected between a first data line and an intermediate node, the fifth transistor having a gate terminal connected to the primary storage node;

a sixth transistor connected between a second data line and the intermediate node, the sixth transistor having a gate terminal connected to the second storage node;

a seventh transistor having a gate terminal connected to the intermediate node; and an eighth transistor connected in series with the seventh transistor between the match line and the discharge line, and wherein the CAM cell further comprises a masking DRAM cell for controlling the eighth transistor.

18. The CAM cell according to claim 17, wherein the masking DRAM cell comprises:

a ninth transistor connected between a third storage node and a third bit line;

a tenth transistor having a gate terminal connected to the third storage node, and a first terminal connected to ground; and an eleventh transistor connected between a second terminal of the tenth transistor and a fourth bit line, wherein the third storage node is connected to a gate terminal of the eighth transistor.

19. The CAM cell according to claim 18, wherein the masking DRAM cell further comprises a twelfth transistor connected between the third storage node and ground, wherein the masking DRAM cell includes a fourth storage node located between the tenth and eleventh transistors, and wherein the twelfth transistor has a gate terminal connected to the fourth storage node.

20. The CAM cell according to claim 9, wherein the comparator circuit comprises:

a fifth transistor connected in series with a sixth transistor between the match line and an intermediate node, a gate terminal of the fifth transistor being connected to the storage node;

a seventh transistor connected in series with an eighth transistor between the match line and the intermediate node, a gate terminal of the seventh transistor being connected to the second storage node; and a ninth transistor connected between the intermediate node and the discharge line, and wherein the CAM cell further comprises a masking DRAM cell for controlling the ninth transistor.

21. The CAM cell according to claim 20, wherein the masking DRAM cell comprises:

a tenth transistor connected between a third storage node and a third bit line;

an eleventh transistor having a gate terminal connected to the third storage node, and a first terminal connected to ground; and a twelfth transistor connected between a second terminal of the eleventh transistor and a fourth bit line, wherein the third storage node is connected to a gate terminal of the ninth transistor.

22. The CAM cell according to claim 21, wherein the masking DRAM cell further comprises a thirteenth transistor connected between the third storage node and ground, wherein the masking DRAM cell includes a fourth storage node located between the eleventh and twelfth transistors, and wherein the thirteenth transistor has a gate terminal connected to the fourth storage node.

23. A content addressable memory (CAM) cell including a dynamic random access memory (DRAM) cell for storing a first data value, and a comparator circuit for discharging a match line to a discharge line when the first data value fails to match an applied data value, wherein the DRAM cell comprises:

a capacitive storage node for storing the first data value, the capacitive storage node being connected to an input terminal of the comparator circuit;

a write transistor connected between the storage node and a write bit line for writing the first data value from the writing bit line to the capacitive storage node during a write operation; and means for indirectly reading the first data value from the capacitive storage node such that the capacitive storage node is undisturbed during a read operation.

24. The CAM cell according to claim 23, wherein said means comprises:

a pull-down transistor having a gate terminal connected to the capacitive storage node; and a read transistor connected in series with the pull-down transistor between a read bit line and ground.

25. A method for operating a content addressable memory (CAM) cell including a dynamic random access memory (DRAM) cell for storing a first data value, and a comparator circuit for discharging a match line to a discharge line when the first data value fails to match an applied data value, wherein the method comprises:

writing the first data value to a storage node of the DRAM cell, wherein the storage node is connected to a gate terminal of a second transistor of the DRAM cell and to a first input terminal of the comparator circuit; and reading the first data value stored in the storage node of the DRAM cell by detecting a voltage across the second transistor.

26. The method according to claim 25, wherein writing the first data value comprises transmitting the first data value on a first bit line and turning on a write transistor connected between the write bit line and the storage node, and wherein reading the first data value comprises pre-charging a second bit line and turning on a read transistor connected between a read bit line and a first terminal of the second transistor such that when the first data value has a first logic state, the second transistor is turned on and the second bit line is biased by a voltage source connected to a second terminal of the second transistor, and when the first data value has a second logic state, the second transistor is turned off and the second bit line remains in a pre-charged state.

* * * * *